US006580326B2

(12) United States Patent
Bach et al.

(10) Patent No.: US 6,580,326 B2
(45) Date of Patent: Jun. 17, 2003

(54) HIGH-BANDWIDTH LOW-VOLTAGE GAIN CELL AND VOLTAGE FOLLOWER HAVING AN ENHANCED TRANSCONDUCTANCE

(75) Inventors: Elmar Bach, Santa Cruz, CA (US); Thomas Blon, Santa Cruz, CA (US); Sasan Cyrusian, Scotts Valley, CA (US); Stephen Franck, Felton, CA (US)

(73) Assignee: Infineon Technologies North America Corp., San Jose, CA (US)

( * ) Notice: Subject to any disclaimer, the term of this patent is extended or adjusted under 35 U.S.C. 154(b) by 62 days.

(21) Appl. No.: 09/865,744

(22) Filed: May 25, 2001

(65) Prior Publication Data

US 2002/0175761 A1 Nov. 28, 2002

(51) Int. Cl.[7] ................................................. H03F 3/16
(52) U.S. Cl. ........................... 330/277; 330/85; 330/98; 330/99; 330/100; 330/257; 330/258; 330/259; 330/292; 360/46; 360/67; 360/68
(58) Field of Search ............................... 330/85, 98, 99, 330/100, 277, 292, 257, 258, 259; 360/46, 67, 68

(56) References Cited

U.S. PATENT DOCUMENTS

| | | | | |
|---|---|---|---|---|
| 4,420,726 A | * | 12/1983 | Limberg | 330/288 |
| 4,825,174 A | * | 4/1989 | Vella-Coleiro | 330/277 |
| 4,835,489 A | * | 5/1989 | Monticelli | 330/277 |
| 5,155,449 A | * | 10/1992 | Ito | 330/277 |
| 5,198,782 A | * | 3/1993 | Scott | 330/277 |
| 5,221,909 A | * | 6/1993 | Cole | 330/253 |
| 5,712,739 A | * | 1/1998 | Nakamura et al. | 360/46 |
| 5,717,536 A | * | 2/1998 | Jung et al. | 360/46 |
| 6,163,218 A | * | 12/2000 | Hashimoto et al. | 330/253 |

OTHER PUBLICATIONS

PRML: Seagate Uses Space Age Technology Today, available at http://www.seagate.com/support/kb/disc/prml.html (Visited Apr. 9, 2001), 2 pages.
Industry Technologies—PRML, Technologies Storage, available at http://wwww.idema.org/about/industry/ind_tech_prml.html (Visited Apr. 9,2001), 1 page.
Hard Disk Data Encoding and Decoding, available at http://www.storagereview.com/guide2000/ref/hdd/geom/data.html (Visited Apr. 9, 2001), 2 pages.
Kozierok, Charles, M., Technical Requirements for Encoding and Decoding, available at http://www.storagereview.com/guide2000/ref/hdd/geom/dataRequirements.html (Visited Apr. 9, 2001), 3 pages.
Kozierok, Charles M., Run Length Limited (RLL), available at http://www.storagereview.com/guide2000/ref/hdd/geom/dataRRLL.html (Visited Apr. 9, 2001), 3 pages.

(List continued on next page.)

Primary Examiner—Michael Tokar
Assistant Examiner—Khai M. Nguyen
(74) Attorney, Agent, or Firm—Brinks Hofer Gilson & Lione

(57) ABSTRACT

A voltage buffer and follower includes a single ended output, a source follower, and a current feedback loop. The current feedback loop is coupled to the source follower and to the single ended output. When two voltage followers are used in a differential configuration, the voltage followers can become part of a high bandwidth gain cell. The high bandwidth gain cell includes a first and a second source follower circuit that are coupled to the first and the second current feedback loops, respectively. The first and the second source follower circuits are further coupled to a first and a second current mirror circuit, respectively. The first and second current mirror circuits are coupled to a load, which is coupled to a common-mode feedback circuit. The common-mode feedback circuit controls a constant current source that sinks mirrored direct currents that flow through the first and the second current mirror circuits.

35 Claims, 7 Drawing Sheets

OTHER PUBLICATIONS

Kozierok, Charles M., Partial Response, Maximum Likelihood (PRML), available at http://www.storagereview.com/guide2000/ref/hdd/geom/dataPRML.html (Visited Apr. 9, 2001), 3 pages.

Kozierok, Charles M., Extended PRML (EPRML), available at http://www.storagereview.com/guide2000/ref/hdd/geom/dataEPRML.html (Visited Apr. 9, 2001), 2 pages.

MR and PRML: Technologies in Synergy, available at http://www.lionsgate.com/Home/baden/public_html_index/SCSI/Quantum_White_Papers/MRHead/MR (Visited Apr. 4, 2001), 4 pages.

Western Digital Corporation—Glossary of term Viterbi Detection, available at http://westerndigital.com/company/glossary.html (Visited Apr. 9, 2001), 1 page.

Fleming, Chip, A Tutorial on Convolutional Coding with Viterbi Decoding, available at http://pwl.netcom.com/~chip.f/viterbi/tutorial.html (Visited Apr. 9, 2001), 4 pages.

Fleming, Chip, A Tutorial on Convolutional Coding with Viterbi Decoding—Description of the Data Generation, Co. . . . v, available at http://pwl.netcom.com/~chip.f/viterbi/algrthms.html (Visited Apr. 9, 2001), 6 pages.

"Synchronous Recording Channels—PRML & BEYOND", rev. 5.61 14.E.18, 1999, published by Knowledge Tek, Inc., Broomfield, Colorado.

* cited by examiner

HIGH-BANDWIDTH LOW-VOLTAGE GAIN CELL AND VOLTAGE FOLLOWER HAVING AN ENHANCED TRANSCONDUCTANCE

FIELD OF THE INVENTION

This invention relates to voltage followers and gain cells, and more particularly, to voltage followers used in high-bandwidth low-voltage gain cells.

BACKGROUND

Differential circuits generate signals that are proportional to the algebraic difference between two input signals. These circuits produce an output signal only when differences exist between the input signals.

Ideally, the output signal of a differential circuit is not dependent on the magnitude of its input signals. However, when input signals are very "weak," such signals can be so small that they cannot be processed reliably. Thus, when feeding "weak" input signals into a differential circuit, the "weak" input signals can be attenuated and the small-signal variations that can exist between these input signals cannot be detected. In other words, the information contained within the input signals and the algebraic difference between them can be lost.

Conceptually, signal amplifiers might be used to condition input signals before the differential circuit processes the input signals. If signal amplifiers are used, the signal amplifiers must be matched and the signal amplifiers must further preserve the information contained within the input signals. One drawback to using signal amplifiers is that the resulting circuit can have a limited bandwidth. Poles of the signal amplifiers can attenuate the input signals at high frequencies, which limit the bandwidth of the differential circuit.

BRIEF DESCRIPTION OF THE DRAWINGS

In the figures, like reference numerals designate similar parts throughout different views.

SUMMARY

The present invention is directed to a high bandwidth low-voltage gain cell that overcomes the above potential drawbacks of the prior art. The present invention is also directed to a voltage follower and buffer having an enhanced transconductance. The presently preferred embodiments minimize signal attenuation and maximize signal bandwidth in hard disk drives and other electromechanical and electronic devices. The presently preferred buffer and voltage follower includes a single-ended output, a source follower, and a current feedback loop. The current feedback loop is coupled to the single-ended output and to the source follower. The current feedback loop attains a high current gain between input and output current by using a high-gain current-to-voltage conversion with a voltage-to-current conversion performed by a common-source transistor.

A presently preferred gain cell embodiment includes a first and a second source follower, a first and a second current feedback loop around the source follower, a first and a second current mirror circuit, a load, a common-mode feedback circuit, and a first and a second constant current source. Preferably, a differential arrangement includes the first and the second source follower circuit that is coupled to the first and the second current feedback loops, respectively. The first and the second source follower circuits are also coupled to the first and second current mirror circuits, respectively. The first and second current mirror circuits are coupled to the load which is coupled to the common-mode feedback circuit. The common-mode feedback circuit controls the constant current source which sinks mirrored currents that flow through the first and the second current mirror circuits.

DETAILED DESCRIPTION OF THE PRESENTLY PREFERRED EMBODIMENTS

A hard drive is an electromechanical device that reads from or writes to platters made of or coated with material(s) that store data. A hard drive can include a spindle on which the platter(s) are supported, motor(s) that drive the platter(s), one or more read/write heads, head positioning mechanisms, a power supply, and a controller. In a hard disk drive a voltage buffer can be used to buffer signals driven by sources with a high source resistance to a low impedance load. A voltage follower might be used, for instance, when the voltage source resistance is much greater than the load resistance. Connecting the voltage source directly to the load without a voltage follower can result in a significant signal attenuation. In such cases, a voltage follower with a high input resistance, much greater than the load resistance, and a low output resistance can be used as a voltage buffer. Similarly, there are applications, such as within a hard drive read circuit, in which the difference between the two input signals must be detected without altering the integrity of the input signals.

Figure 1:
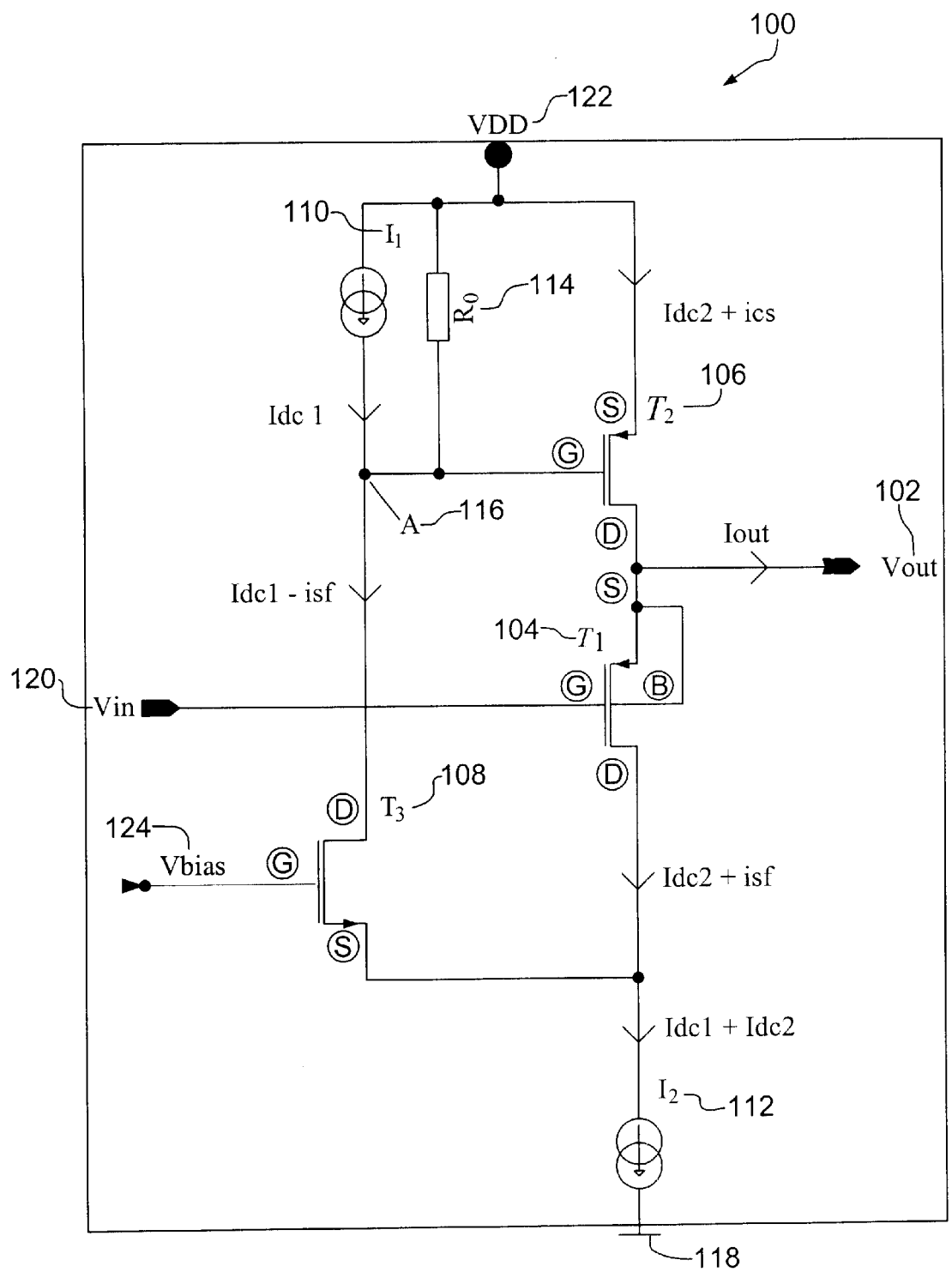
FIG. 1 is a schematic of a presently preferred voltage follower embodiment.

FIG. 1 is a schematic of a presently preferred voltage follower embodiment 100. The presently preferred embodiment 100 having a single-ended output 102 includes three transistors: a source-follower transistor $T_1$ 104, a common-source transistor $T_2$ 106, and a folded-cascode transistor $T_3$ 108, and two constant current sources $I_1$ 110 and $I_2$ 112. The first and second transistors $T_1$ 104 and $T_2$ 106 are preferably P-channel Metal Oxide Semiconductor Field-Effect Transistors (PMOS FETS) and the third transistor $T_3$ 108 is preferably an N-channel Metal Oxide Semiconductor Field-Effect Transistor (NMOS FET).

Preferably, the output voltage of the presently preferred voltage follower embodiment 100 follows the input voltage. In the presently preferred embodiment 100, the output voltage differs from the input voltage by a gate-source voltage that depends on the threshold voltage $V_t$ of the source-follower transistor $T_1$ 104. This threshold voltage $V_t$ is defined during the fabrication process where the threshold voltage $V_t$ is the minimum gate voltage necessary for the onset of current flow between the source and the drain. Furthermore, the gate-source voltage of the source-follower transistor $T_1$ 104 depends on the bias current flowing from the source to the drain.

Preferably, the source-follower transistor $T_1$ 104 and the folded-cascode transistor $T_3$ 108 are biased by a current sink or the current source $I_2$ 112. The drain current $I_{DC1}$ of transistor $T_3$ 108 is defined by current source $I_1$ 110. The drain biasing current $I_{DC2}$ of the source-follower transistor $T_1$ 104 is preferably the difference between the currents flowing from current sources $I_1$ 110 and $I_2$ 112, wherein the current source $I_2$ 112 conducts a combined direct current (DC) denoted as $I_{DC1}+I_{DC2}$. The symbol $R_0$ 114 interconnected between the source and the gate of the common-source transistor $T_2$ 106 illustrates the output impedance of current source $I_1$ 110. Due to a high gate resistance of the common source transistor $T_2$ 106 in the presently preferred embodiment, $R_0$ 104 is a significant portion of the total impedance measured from node A 116 to ground 118. However, the total impedance from node A 116 to ground 118 will depend on the transconductance of the folded-cascode transistor $T_3$ 108, the output impedance of the current source $I_2$ 112, and the impedance as seen into the drain of the source-follower transistor $T_1$ 104.

Preferably, the output voltage generated at terminal $V_{out}$ 102 follows the input voltage received at terminal $V_{in}$ 120. However, the dynamic behavior of the presently preferred voltage follower embodiment 100 can be characterized by the time delays or propagation delays that occur when the input voltage changes. Since most switches exhibit nonzero switching times and inevitably have some capacitance between nodes, circuit function can depend on the delayed response of the switches, such as the transistors used in the presently preferred voltage follower embodiment 100.

When the input signal received at terminal $V_{in}$ 120 decreases, for example, a propagation delay causes the gate source voltage $V_{gs}$ of the source-follower transistor $T_1$ 104 to initially increase. The signal generated at $V_{out}$ 102 does not change instantaneously with the signal received at $V_{in}$ 120. As $V_{gs}$ increases the conducting channel induced within the source-follower transistor $T_1$ 104 increases and an alternating output current is correspondingly generated. This alternating current (AC) denoted $i_{source\ follower}$ or $i_{sf}$ adds to the steady state DC current $I_{DC2}$ flowing through the conducting channel of the source-follower transistor $T_1$ 104. Because $I_2$ 112 is not configured or programmed to sink $i_{sf}$, $i_{sf}$ is substantially added to $I_{DC1}$ at the gate of the common-source transistor $T_2$ 106 and the drain of the folded-cascode transistor $T_3$ 108 at node A 116. As the AC current at node A 116 increases, a relatively large AC gate bias voltage supplements the DC gate bias of the common-source transistor $T_2$ 106 due in part to the large impedance $R_0$. These gate biases cause the conducting channel of the common-source transistor $T_2$ 106 to decrease. The effective decrease in the gate source voltage bias $V_{gs}$ decreases the current through $T_2$ 106 sourced by a DC supply Vdd 122, and hence, results in an AC current $i_{common\ source}$ also denoted as $i_{cs}$. Eventually, the difference between the input voltage received at terminal $V_{in}$ 120 and the output voltage produced at terminal $V_{out}$ 102 comes within a voltage range defined substantially by the threshold voltage $V_t$ of the source-follower transistor $T_1$ 104 and the DC bias current $I_{DC2}$.

As shown, the folded-cascode transistor $T_3$ 108, the two current-sources ($I_1$ 110, $I_2$ 112), and the common-source transistor $T_2$ 106 form a current-feedback loop around the source-follower transistor $T_1$ 104. The total transconductance or ratio of input AC voltage to output AC current ($g_m$) of this presently preferred embodiment is much higher than the transconductance of either the source-follower transistor $T_1$ 104 or the common-source transistor $T_2$ 106 which is set by the bias current $I_{DC2}$. The dynamic increase or boosting of the transconductance of the common-source transistor $T_2$ 106 is achieved by applying an induced AC voltage to the gate of the common-source transistor $T_2$ 106. The AC voltage is achieved through a high-gain current-to-voltage conversion that utilizes the sensed AC current $i_{sf}$ at node 116 A. Preferably, the AC drain current $i_{cs}$ of the common-source transistor $T_2$ 106 of this presently preferred embodiment 100 is boosted and has an inverted phase when compared to the AC current $i_{sf}$. The current-feedback loop minimizes the AC current $i_{sf}$ that flows through the source-follower transistor $T_1$ 104 to obtain the current that flows through the source-follower that is close to the DC current $I_{DC2}$. Hence, the gate-source voltage of the source-follower transistor $T_1$ 104 is a constant offset voltage between input $V_{in}$ 120 and output $V_{out}$ 102 and largely independent of the AC operation. The AC output current $i_{out}$ required to change the voltage level at the output node $V_{out}$ 102 is driven by the common-source transistor $T_2$ 106 and the magnitude of $i_{out}$ is substantially equal to or close to the magnitude of $i_{cs}$. Accordingly, the transconductance of the presently preferred voltage follower 100 is much higher than the transconductance of a source-follower transistor $T_1$ 104 alone.

The small-signal gain of the presently preferred voltage follower 100 is dependent on the output impedance of the voltage follower and the load impedance. The small-signal output impedance of the presently preferred embodiment 100 is inversely proportional to the transconductance of the common-source transistor $T_2$ 106. Due to the boosted transconductance operation of the presently preferred embodiment 100, the signal attenuation of the circuit is small.

Preferably, the gate-source voltage of the source-follower transistor $T_1$ 104 is almost constant even with a small-signal variation of the input signals. The capacitance seen by the circuit or source driving the gate of the source-follower transistor $T_1$ 104 at terminal $V_{in}$ 120 is preferably determined by the gate-source capacitance and the gate-drain capacitance of the source-follower transistor $T_1$ 104. Since the change of the gate-source voltage is preferably very small due to the operation of the current-feedback loop, the loading due to the gate-source capacitance is preferably reduced. This reduced loading effect is true even at very high frequencies due to the high bandwidth of the current-feedback loop. The effect of the gate-drain capacitance is preferably small too, due to the operation of the source-follower transistor $T_1$ 104 in the saturation range and due to the low impedance at the source of the folded-cascode transistor $T_3$ 108 which avoids a dynamic increase in Miller-effect capacitance.

As seen in FIG. 1, preferably the bulk and source terminals of the source-follower transistor $T_1$ 104 are directly connected. Preferably, this direct continuity between the bulk and the source terminal further minimizes the signal attenuation caused by the loads that can be coupled to terminal $V_{out}$ 102 because the $g_m$ of the source-follower $T_1$ 104 is optimum. In those alternative presently preferred embodiments having the bulk terminal tied to an AC ground voltage, e.g., a positive supply voltage in the case of a PMOS FET source-follower transistor $T_1$ 104, a boost of the gate and bulk transconductance will be achieved. The bulk transconductance thus has a negative effect and reduces the benefits of the current-feedback transconductance boosting loop. The small signal attenuation in this case depends on the ratio of the gate and bulk transconductance. Preferably, this signal attenuation is less dependent or is independent of the loads coupled to the terminal $V_{out}$ 102.

The above-described voltage follower embodiments 100 are not limited to the illustrated components (i.e. PMOS or NMOS transistors) as the presently preferred embodiments 100 can also comprise transistors built in a complimentary manner by exchanging PMOS FETs with NMOS FETs and NMOS FETs with PMOS FETs. Furthermore, many suitable current supplies or transistors such as cascode transistors, for example, can be used as current sources $I_1$ 110 and $I_2$ 112 to enhance the output impedance of the current sources just as the gate bias at terminal $V_{bias}$ 124 of the folded-cascode transistor $T_3$ 108 can be driven by any suitable external or internal source or bias block or a bias voltage generator.

Figure 2:
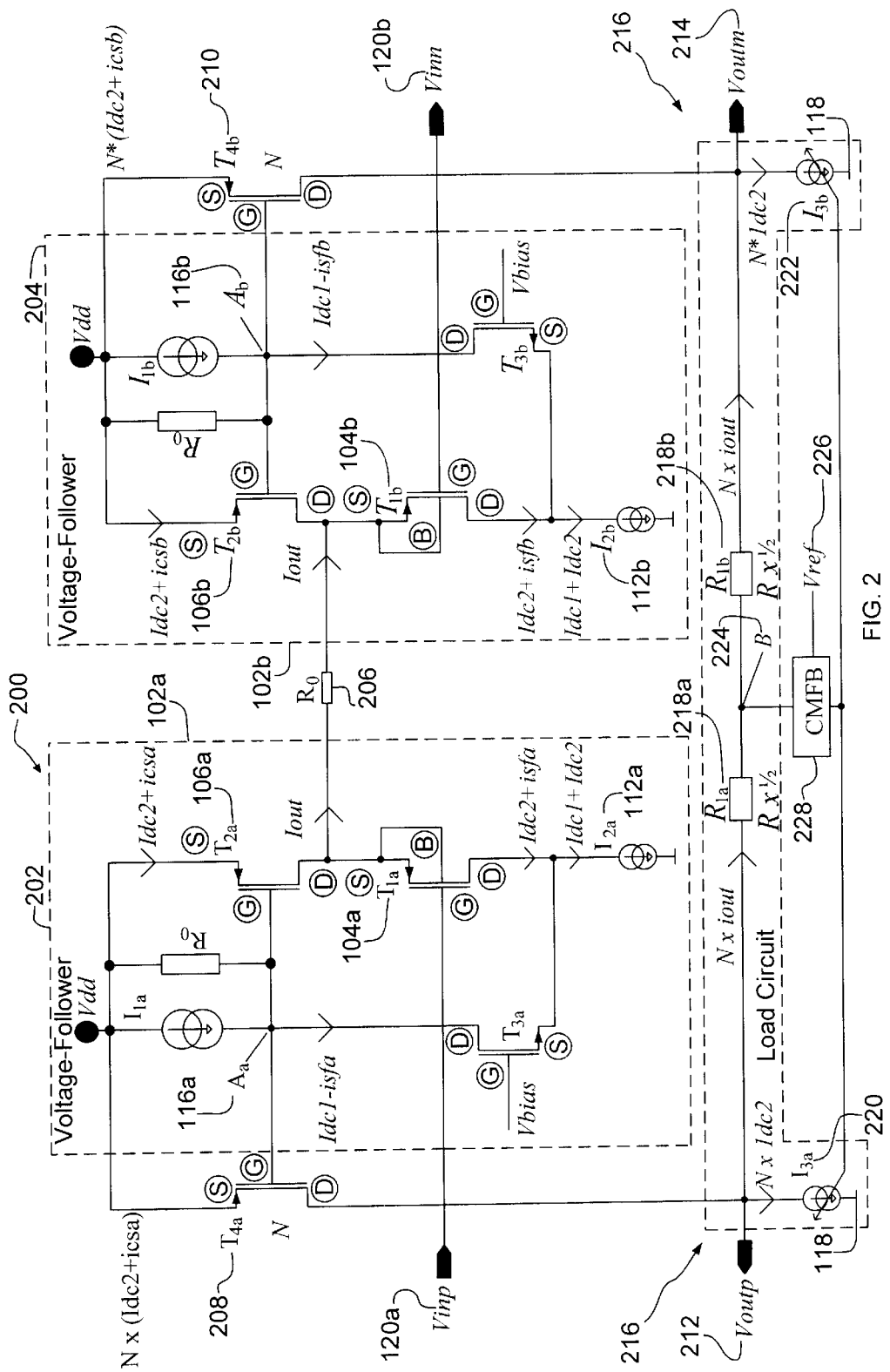
FIG. 2 is a schematic of a presently preferred gain cell embodiment incorporating FIG. 1.

The presently preferred voltage follower embodiment 100 can also be a unitary part of or integrated within a fixed or a variable presently preferred gain cell embodiment within a discrete circuit or an integrated circuit. As shown in FIG. 2, the presently preferred gain cell embodiment 200 comprises two voltage followers 202 and 204 having output terminals joined by a passive component such as the illustrated resistor $R_0$ 206. The latter or passive component can also be implemented with an active component such as a variable resistor or transistor. In one presently preferred embodiment, the transistor can be a NMOS device that operates within the linear range and is biased by a high gate voltage. By adjusting the gate voltage of the NMOS device in the linear range, the resistance value of the induced conducting channel correspondingly changes just as the variable gain of this presently preferred alternative embodiment changes.

The presently preferred gain cell embodiment 200 utilizes a pair of transistors $T_{4a}$ 208 and $T_{4b}$ 210 to track and output the current that flows through $R_0$ 206. Preferably, the pairs of transistors $T_{2a}$ 106a, $T_{4a}$ 208 and $T_{2b}$ 106b and $T_{4b}$ 210 are in current-mirror configurations that track current flow through the common-source transistors $T_{2a}$ 106a and $T_{2b}$ 106b, respectively. Although transistors $T_{4a}$ 208 and $T_{4b}$ 210 are not matched to $T_{2a}$ 106a and $T_{2b}$ 106b, respectively, to provide a gain N, in other presently preferred alternative embodiments pairs of matched transistors can be used. Accordingly, the presently preferred embodiments can utilize a one to one current-mirror configuration or a one to N current-mirror configuration depending on the desired output gain generated at terminals $V_{outp}$ 212 and $V_{outm}$ 214. The current-mirror ratio N may also be controlled by digital logic which adjusts the gain of the presently preferred alternative embodiment by controlling transistors positioned in parallel to transistors $T_{4a}$ 208 and $T_{4b}$ 210.

As shown, the current mirrors $T_{2a}$ 106a, $T_{4a}$ 208 and $T_{2b}$ 106b, $T_{4b}$ 210 provide multiple references of the current flowing through the common-source transistors $T_{2a}$ 106a and $T_{2b}$ 106b to a presently preferred load embodiment 216. Preferably, the presently preferred load embodiment 216 performs a current-to-voltage conversion using a differential resistor $R_1$ which equals $R_{1a}$ 218a plus $R_{1b}$ 218b and two current sources $I_{3a}$ 220 and $I_{3b}$ 222 which are controlled by a common-mode feedback circuit 228. Preferably, the common-mode voltage at output terminals $V_{outp}$ 212 and $V_{outm}$ 214 is controlled by the current sources $I_{3a}$ 220 and $I_{3b}$ 222 which sink the DC current flowing through the common-source transistors $T_{4a}$ 106a and $T_{4b}$ 106b. Preferably, the current sources $I_{3a}$ 220 and $I_{3b}$ 222 sink the DC current components $N \times I_{DC2}$ flowing through $T_{4a}$ 208 and $T_{4b}$ 210 leaving only the differential currents $N \times i_{csa}$ and $N \times i_{csb}$, respectively, at the output terminals $V_{outp}$ 212 and $V_{outm}$ 214.

The voltage drop across $R_{1a}$ 218a and $R_{1b}$ 218b, which are both equal to ½ of $R_1$, is the differential output voltage of the presently preferred embodiment and the voltage gain $N \times R1/R0$ is set by the ratio of the resistors and the current mirror ratio. Accordingly, the presently preferred gain cell embodiment 200 can capture the difference between the signals received at terminals $V_{inp}$ 120a and $V_{inm}$ 120b by measuring the current $N \times i_{out}$ flowing through the resistors $R_{1a}$ 218a and $R_{1b}$ 218b.

Preferably, a node B 224 positioned between the two resistors $R_{1a}$ 218a and $R_{1b}$ 218b is a virtual AC ground. The voltage at this node B 224 is equal to the common mode voltage at the output terminals $V_{outp}$ 212 and $V_{outm}$ 214 and can be compared to a reference voltage received at a voltage reference terminal $V_{ref}$ 226 by the common-mode feedback circuit 228 which adjusts the common-mode voltage of the output nodes $V_{outp}$ 212 and $V_{outm}$ 214. Preferably, the common-mode feedback circuit 228 compares the voltage at virtual AC ground node B 224 to an internal reference voltage or a reference voltage generated by an external source, and further controls current sources $I_{3a}$ 220 and $I_{3b}$ 222 to sink appropriate $N \times I_{DC2}$ currents.

Figure 3:
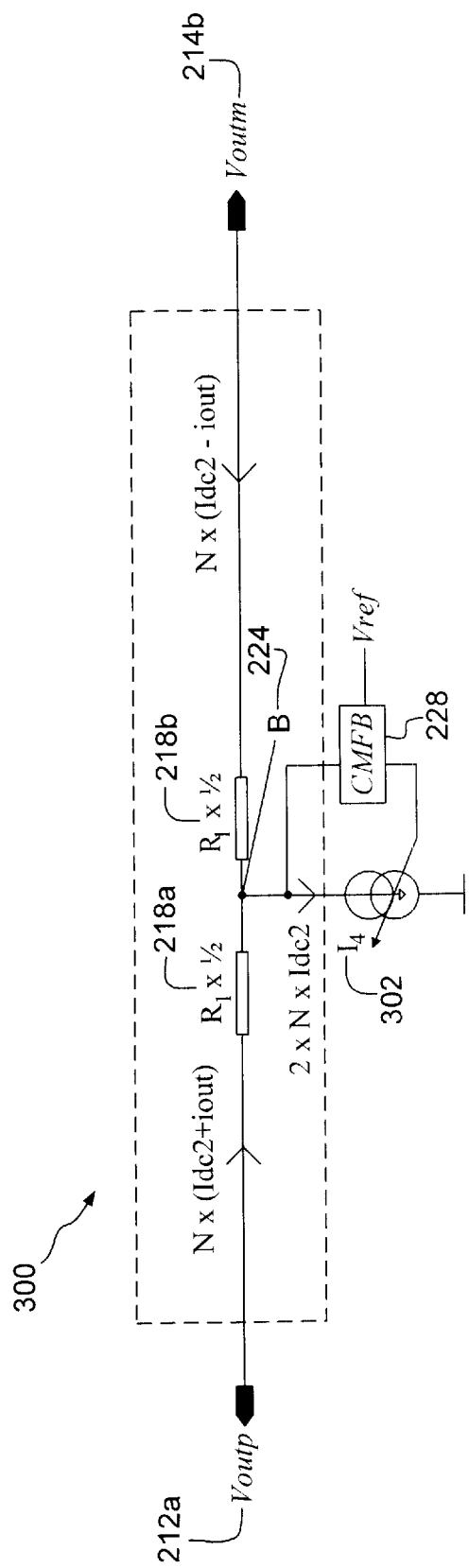
FIG. 3 is a schematic of a presently preferred alternative load embodiment that can be incorporated within FIG. 2.

FIG. 3 is a presently preferred alternative load embodiment 300 that can replace the load embodiment 216 of FIG. 2. Preferably, this alternative load embodiment performs a current-to-voltage conversion using the differential resistor $R_1$ 218a and 218b and a single current source $I_4$ 302 which is controlled by a common-mode feedback circuit 228. Preferably, the single-current source $I_4$ 302 conducts two times the DC current than that of one of the current sources $I_{3a}$ 220 or $I_{3b}$ 222 of FIG. 2. The use of the differential resistors $R_1 \times ½$ 218a and 218b results in a DC voltage shift of the DC common-mode voltage at terminals $V_{outp}$ 212a and $V_{outm}$ 214b by ($N \times R_1 \times ½ \times I_{DC2}$). Moreover, the capacitance of the current-source $I_4$ 302 does not appear as a load capacitance at the output terminals $V_{outp}$ 212a and $V_{outm}$ 214b. Since the current source $I_4$ 302 is connected to the virtual AC ground node B 224, the selection of the output impedance of current source $I_4$ 302 can vary. Finally, it should be noted that common-mode voltage is controlled by the common-mode feedback circuit 228 by tapping the common-mode level at the virtual AC ground node B 224, by controlling the DC current sunk by the current-source $I_4$ 302, and taking into account the DC voltage shift through the load resistors $R_1 \times ½$ 218a and 218b.

Figure 4:
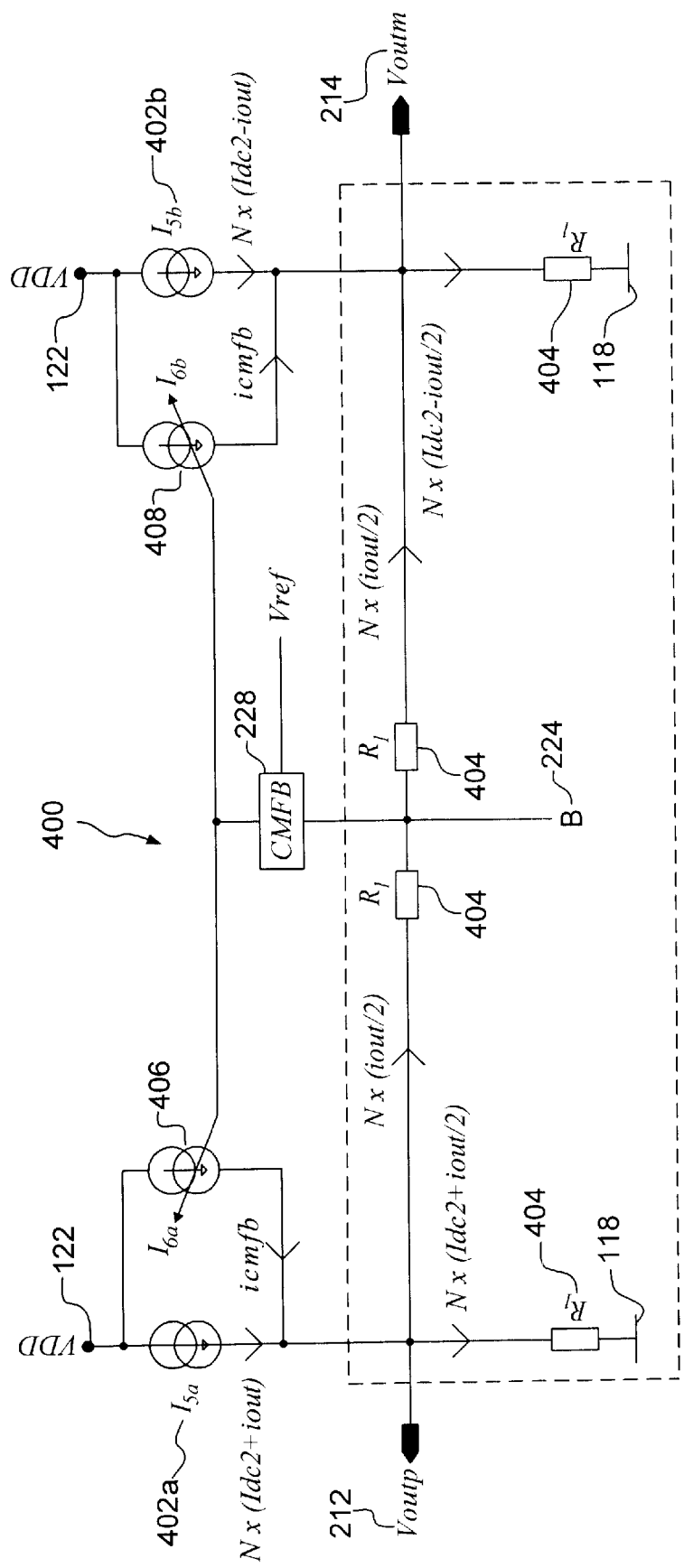
FIG. 4 is a schematic of a second presently preferred alternative load embodiment that can be incorporated within FIG. 2.

FIG. 4 is a presently preferred third load embodiment 400 to load embodiment 216 of FIG. 2 wherein the transistors $T_{4a}$ 208 and $T_{4b}$ 210 of FIG. 2 (illustrated as current sources $I_{5a}$ 402a and $I_{5b}$ 402b in FIG. 4) are connected in parallel with constant current sources $I_{6a}$ 406 and $I_{6b}$ 408. As shown, this alternative load embodiment 400 avoids sinking current flowing through output terminals $V_{outp}$ 212 and $V_{outm}$ 214 directly to ground 118. Rather, the output terminals $V_{outp}$ 212 and $V_{outm}$ 214 are isolated from ground 118 by two resistors $R_1$ 404. Because these resistors $R_1$ 404 are in parallel with two other resistors $R_2$ 405 that couple terminals $V_{outp}$ 212 to $V_{outm}$ 214, the effective resistance between $V_{outp}$ 212 and $V_{outm}$ 214 can be made about equal or equal to the effective resistance of the presently preferred load embodiment 216 of FIG. 2. If $R_2$ is much larger than $R_1$ the purpose of the resistors $R_2$ 405 is to tap the common-mode voltage of the output nodes. Moreover, the presently preferred third load embodiment 400 can process a very low common-mode level. In one presently preferred embodiment, common-mode levels below about 400 millivolts can be attained.

As further shown in FIG. 4, two current sources $I_{6a}$ 406 and $I_{6b}$ 408 are controlled by the common-mode feedback circuit 228 that also monitors the common-mode level at the virtual AC ground node B 224. Preferably, the current sources $I_{6a}$ 406 and $I_{6b}$ 408 source a sufficient current to increase or decrease the common-mode level at terminals $V_{outp}$ 212 and $V_{outm}$ 214. Both current sources $I_{6a}$ 406 and $I_{6b}$ 408 can be designed to have very high output impedance because of the large DC voltage difference between VDD 122 and the common-mode voltage level at the output terminals $V_{outp}$ 212 and $V_{outm}$ 214. Hence, the small-signal gain is not attenuated as much by the parasitic output impedance of the current sources $I_{6a}$ 406 and $I_{6b}$ 408.

Figure 5:
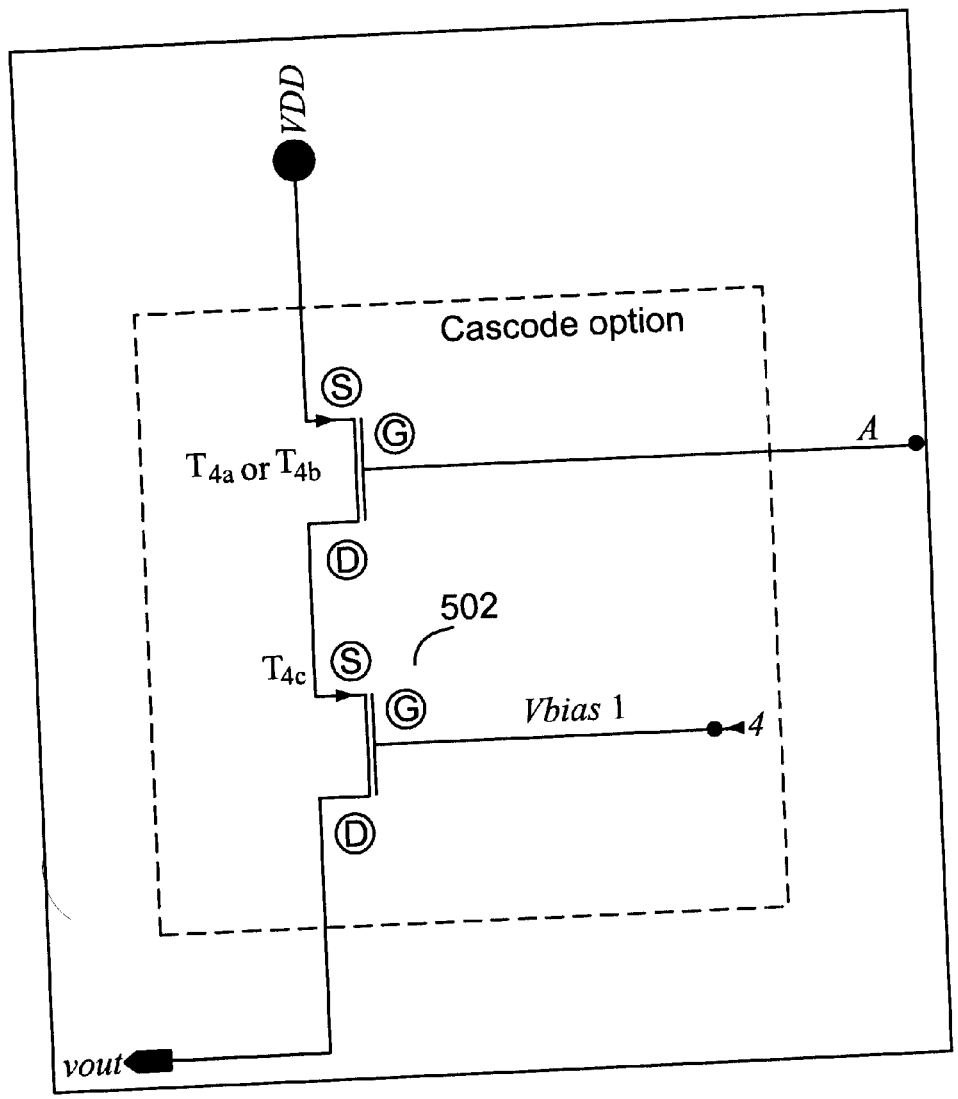
FIG. 5 is a schematic of a presently preferred cascode embodiment that can be incorporated within FIGS. 2, 3 and 4.

To improve the output impedance of the common-mode feedback current-sources, a cascode transistor $T_{4c}$ 502 can be added in series to the constant current source $I_{5a}$ 402a and a second cascode transistor $T_{4c}$ 502 can be added in series to $I_{5b}$ 402b shown in FIG. 4. Additionally, a cascode transistor $T_{4c}$ 502 can be coupled in series between $T_{4a}$ 208 and the terminal $V_{outp}$ 212 and a second cascode transistor $T_{4c}$ 502 can be coupled in series between $T_{4b}$ 210 and the terminal $V_{outm}$ 214 of FIG. 2. Preferably, the cascode transistors, one of which is shown in FIG. 5, are coupled to the respective drains of $T_{4a}$ 208 and $T_{4b}$ 210. Preferably, the cascode transistors are gate biased by the same DC voltage as the input common-mode voltage. When fabricated within an integrated circuit, transistors $T_{4c}$ can have a W and L ratio that is N times the W and L ratio of the source-follower transistors $T_{1a}$ 104a and $T_{1b}$ 104b. Accordingly, in this presently preferred embodiment, the drain nodes of cascode transistors $T_{4c}$ 502 will be at about the same potential as the drain nodes of the common-source transistors $T_{2a}$ 106a and $T_{2b}$ 106b. Accordingly, the presently preferred cascode supplements the very accurate current-mirror circuits with a very high output impedance. The cascode transistors may be shared between the common-mode current source transistors and the signal-path transistors $T_{4a}$ 208 and $T_{4b}$ 210.

Figure 6:
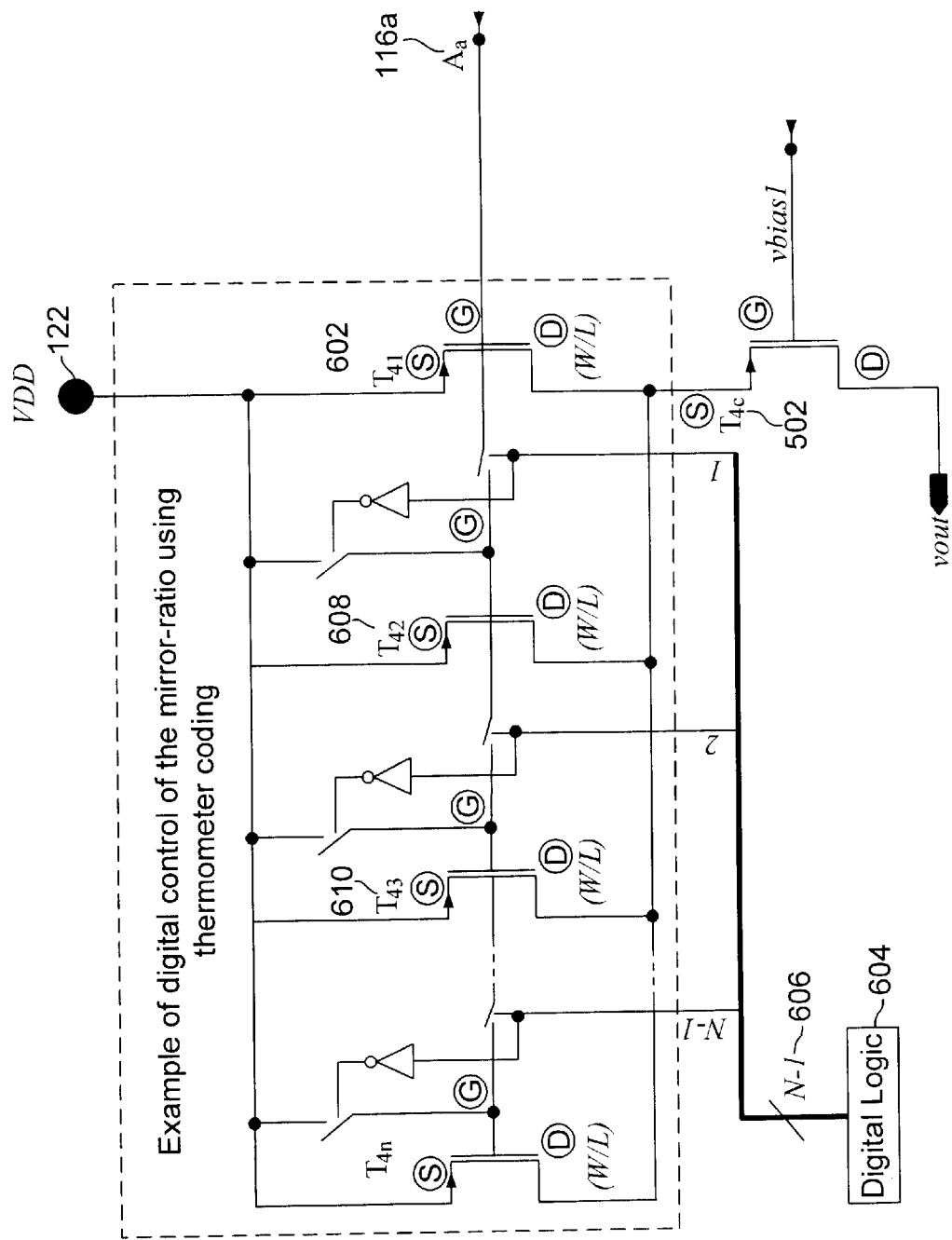
FIG. 6 is a schematic of presently preferred digital logic that can be incorporated within FIGS. 2, 3 and 4.

FIG. 6 illustrates presently preferred logic that can be incorporated within the embodiments of FIGS. 2, 3, and 4. In these presently preferred embodiments, transistors $T_{4a}$ 208 and $T_{4b}$ 210 of FIG. 2 and current sources $I_{5a}$ 402a and $I_{5b}$ 402b of FIG. 4 can each be implemented with the circuits shown in FIG. 6. In these presently preferred embodiments, N−1 transistors $T_{42}$–$T_{4N}$ are coupled in parallel to transistor $T_{41}$ 602. The gate bias of these transistors are controlled by digital logic 604 having N−1 control lines 606 that separately drive the selected transistor(s) by a common gate bias. To drive transistor $T_{42}$–$T_{4N}$ on, each proceeding transistor must be activated. For example, to turn $T_{43}$ on, $T_{42}$ and $T_{41}$ must first be on. When a second digital control line 606 is driven to a logic high, the gate of $T_{43}$ 610 will share the gate bias of $T_{42}$ 608 and $T_{41}$ 602. This common gate bias turns $T_{43}$ 610 on.

Preferably, each transistor $T_{42}$–$T_{4N}$ shown in FIG. 6 has a substantially equal width and length. The sequential activation of each selected transistor increases the source bias of $T_{4c}$ 502 monotonically or by equal increments. Preferably, the above-described embodiments are a unitary part of an integrated circuit, although matched transistors can also be used in alternative presently preferred discrete embodiments. Preferably, the number of digitally actuated transistors defines the multiplication factors or current mirror ratios used in these presently preferred embodiments. Moreover, thermometer codes are preferably used to control the switches that bias the gates.

Figure 7:
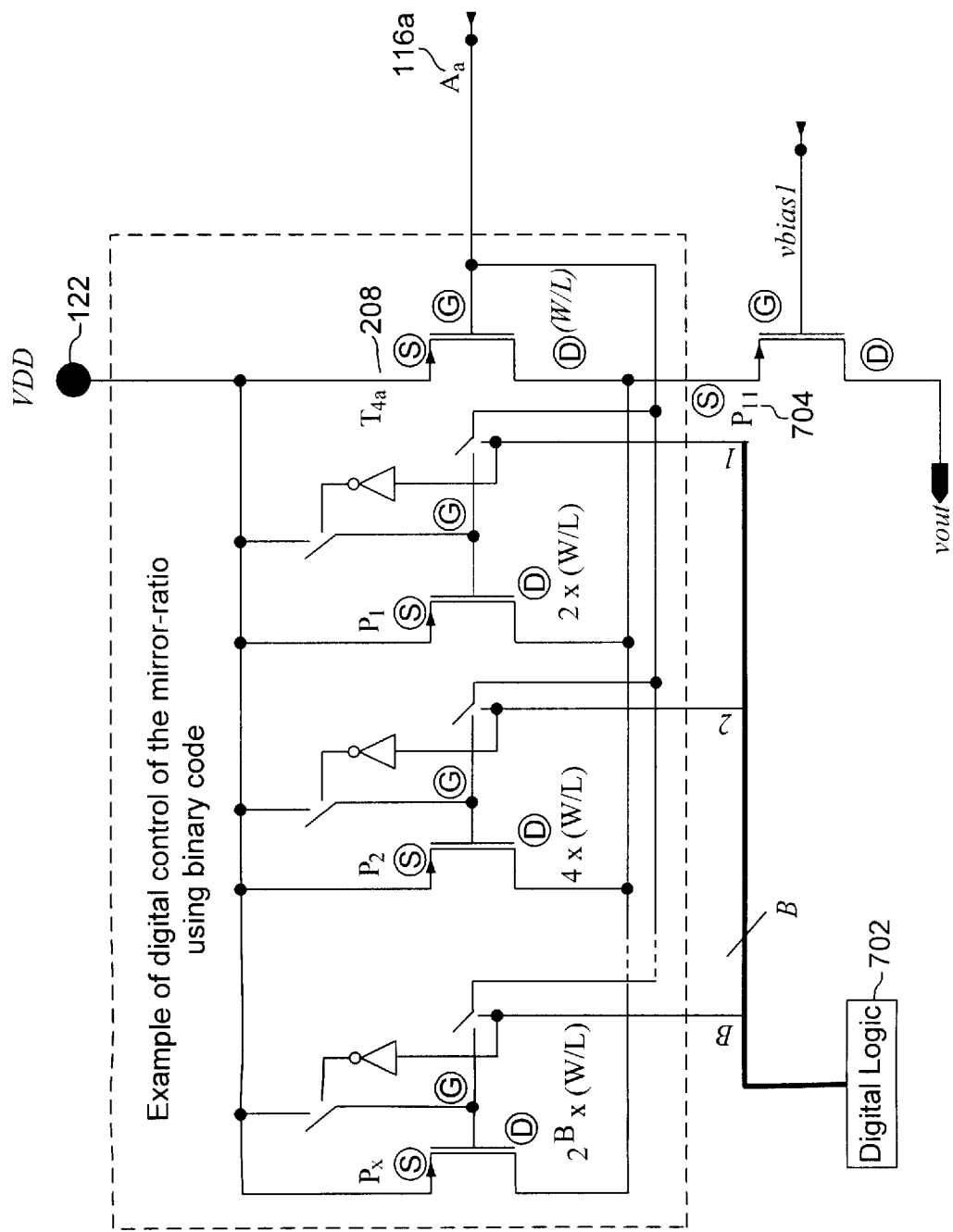
FIG. 7 is a schematic of presently preferred alternative digital logic that can be incorporated within FIGS. 2, 3 and 4.

The above-described embodiments are not limited to thermometer codes or to sequential logic. As shown in FIG. 7, binary codes having "B" bit lengths and a non-sequential control can also be used. Preferably, the gates of transistors $P^1$–$P^*$ are coupled in parallel with transistor $T_{4a}$ 208. Since two voltage-follower circuits 202 and 204 are used FIG. 2, preferably an identical circuit would be coupled in parallel with transistor $T_{4b}$ 210. This configuration preferably allows combinations of output current to bias the source of P11. While a multiplier of $2^n$ is shown in FIG. 7 (e.g., $2^{n*}$ (W/L)), many other multipliers can also be used including integer and non-integer multipliers. Preferably, transistors $P^1$–$P^*$ are directly activated by the binary codes generated by the digital logic 702 that couples transistors $P^1$–$P^*$ through separate control lines. The activation of the digitally selected transistors can define the current mirror ratios of the presently preferred embodiments. A shown, the digital logic 702 drives B transistors. Moreover, the above-described embodiments can be implemented in an integrated or discrete circuit.

Preferably, the cascode transistors $T_{4C}$ 502 and $P_{11}$ 704 of FIGS. 6 and 7 can be shared between all transistors of the current mirrors. To improve the accuracy of the current mirrors, each of the current mirror transistors can be connected in series to an individual cascode transistor, which has a W/L ratio that is adjusted to the W/L ratio of the related current mirror transistors. In these presently preferred embodiments, each of the cascode transistors are connected to the output node $V_{out}$.

From the foregoing detailed description, it should be apparent that a high-bandwidth gain cell can comprise two high-bandwidth voltage-follower circuits 202 and 204 that copy the difference between input voltages to the differential voltage across a resistor $R_0$ 106. The presently preferred voltage-followers 202 and 204 comprise source-followers 104a and 104b with enhanced transconductance that are embedded within current-feedback loops. The AC voltage across $R_0$ 206, results in an AC current $i_{out}$ through $R_0$ 206 that is proportional to the differential input voltage. The presently preferred voltage-follower circuits 202 and 204 preferably maintain the magnitude of the AC current $i_{out}$ that flows through $R_0$ 206 close to the magnitude of the AC current $i_{CS}$ that flows through transistors $T_{2a}$ 106a and $T_{2b}$ 106b. By using two additional devices $T_{4a}$ 208 and $T_{4b}$ 210 current-mirrors with a ratio $N \geq 1$ can be built that feed mirror currents to an output load embodiment. One preferred load embodiment 216 comprises two DC current-sources $I_{3a}$ 220 and $I_{3b}$ 222 that subtract the DC component $I_{DC2}$ from the currents flowing through $T_{4a}$ 208 and $T_{4b}$ 210. Provided that the impedance of the external loads connected to terminals $V_{outp}$ 212 and $V_{outm}$ 214 are high and the output impedance of the current-sources $I_{2a}$ 112a and $I_{2b}$ 112b are high, the AC current $i_{out}$ will flow through resistor $R_1$ 218a and 218b. The gain of the presently preferred gain-cell embodiment 200 is set by the ratio of the two resistors $R_0$ 206 and $R_1$ 218a and 218b and the current mirror ratio N.

The above-described embodiments can be used with many applications including repetitive storage devices, hard drives, and other electromechanical devices. The common-mode voltages at the input and output terminals enable the presently preferred gain cell embodiments to drive several external loads and circuits, such as circuits within a hard disk drive read-channel. Both input and output common-mode voltages can be equal thereby enabling a series connection of two gain cells without requiring additional circuitry that reduces signal bandwidth. The high bandwidth of the enhanced transconductance voltage-follower embodiments will not attenuate the input signals at high frequencies. Moreover, there is a low attenuation of the differential input voltages when the presently preferred voltage follower embodiments are used to buffer $R_0$ 206. Moreover, the above-described presently preferred embodiments can operate at very low supply voltages, such as, for example, at less than or equal to about two volts (i.e., Vdd<=2V DC). Furthermore, the presently preferred embodiments can be implemented entirely in Complementary Metal Oxide Semiconductor (CMOS) technology.

While various embodiments of the invention have been described, it will be apparent to those of ordinary skill in the art that many more embodiments and implementations are possible that are within the scope of this invention. Accordingly, the invention is not to be restricted except in light of the attached claims and their equivalents.

We claim:

1. A voltage follower, comprising:
    a single-ended output;
    a source follower coupled to the single-ended output;
    an input terminal coupled to the source follower; and
    a current feedback loop coupled to the single-ended output and the source follower, the source follower comprising a bulk terminal coupled to a source terminal, the current feedback loop being configured to have a high current-gain using a common-source transistor, wherein the source-follower is configured to maintain the single ended output at a fixed offset voltage above an input terminal voltage, and wherein the fixed offset voltage is determined by a threshold voltage of the source-follower and a biasing current flowing through the source-follower.

2. The voltage follower of claim 1, wherein the source follower and current feedback loop are configured to conduct alternating currents, wherein the alternating current flowing through the source follower has an inverted phase in comparison to the alternating current flowing through the common-source transistor in the current feedback loop which enables a negative feedback.

3. The voltage follower of claim 1, wherein the source follower is configured to conduct only a small portion of an alternating current that flows through the single ended output.

4. The voltage follower of claim 1, wherein the current feedback loop comprises a cascode circuit.

5. The voltage follower of claim 4, wherein the cascode circuit and the source follower are biased by a constant current source.

6. The voltage follower of claim 1, wherein the current feedback loop comprises a common source circuit, a folded cascode circuit, and two current sources, wherein the folded cascode circuit is coupled to the common source circuit and the two current sources.

7. The voltage follower of claim 6, wherein the current sources are constant direct current sources and the direct current flowing through the source-follower and the common source transistor are substantially equal.

8. The voltage follower of claim 6, wherein an input capacitance is determined by a gate-source and a gate-drain capacitance, wherein the gate-source capacitance is small due to a current-feedback and the gate-drain capacitance is small by avoiding a Miller-Effect by having a low impedance node at a drain of the source-follower transistor.

9. A voltage follower, comprising:
    a single-ended output;
    a source follower coupled to the single-ended output;
    an input terminal coupled to the source follower; and
    a current feedback loop coupled to the single-ended output and the source follower, the source follower comprising a bulk terminal coupled to a drain terminal, the current feedback loop being configured to have a high current-gain using a common-source transistor, wherein the source-follower is configured to maintain the single ended output at fixed offset voltage above an input terminal voltage, and wherein the fixed offset voltage is determined by a threshold voltage of the source-follower and biasing current flowing through the source-follower.

10. A buffer, comprising:
    an output;
    a source follower circuit coupled to the output;
    a common source circuit coupled to the output and to the source follower circuit;
    a folded cascode circuit coupled to the common source circuit and to the source follower circuit; and
    a plurality of direct current sources coupled to the folded cascode circuit to generate a high-gain current-to-voltage conversion at a gate of the common source circuit, wherein at least one of the current sources is directly coupled to the source-follower circuit and to the folded cascode circuit and comprises a cascode circuit and wherein the common source circuit, the folded cascode circuit, and the plurality of direct current sources operate at a supply voltage of less than two volts.

11. The buffer of claim 10, wherein the current sources are directly coupled to the source-follower circuit and to the folded cascode circuit and comprise a cascode circuit.

12. The buffer of claim 10, wherein the common source circuit, the folded cascode circuit, and the plurality of direct current sources operate at a supply voltage of about two volts.

13. The buffer of claim 11, wherein said at least one of the current sources is a current sink.

14. A buffer of claim 11, wherein the folded cascode circuit is coupled to a bias voltage generator.

15. A hard disk drive read-channel gain cell, comprising:
    a first and a second current feedback loop;
    a differential pair comprising a first source follower circuit and a second source follower circuit, the first source follower circuit being coupled to the first current feedback loop and the second source follower circuit being coupled to the second current feedback loop;
    a first current mirror circuit coupled to the first source follower circuit;
    a second current mirror circuit coupled to the second source follower circuit;
    a load coupled to the first and the second current mirror circuit;
    a common-mode feedback circuit coupled to the load; and
    a constant current source coupled to the first and the second current mirror circuits and to the common-mode feedback circuit, the constant current source being configured to sink mirrored currents that flow through the first and the second current mirror circuits when controlled by the common-mode feedback circuit.

16. The hard disk drive read-channel gain cell of claim 15, further comprising a third constant current source, wherein each of the first and second current mirror circuits are biased by the respective third constant current source.

17. The hard disk drive read-channel gain cell of claim 15, wherein the current-mirror ratio N may be larger than unity and may be controlled by a digital logic.

18. The hard disk drive read-channel gain cell of claim 15 wherein the differential pair, the first current mirror circuit, the second current mirror circuit, the common-mode feedback circuit, and the constant current source are configured to operate at a supply voltage below about two volts.

19. The hard disk drive read-channel gain cell of claim 15, wherein the differential pair, the first current mirror circuit, the second current mirror circuit, the common-mode feedback circuit, and the constant current source are CMOS devices.

20. The hard disk drive read-channel gain cell of claim 15, further comprising a pair of output terminals and a second hard disk drive read-channel gain cell, wherein the output terminals are coupled to the first and the second current mirror circuits and are directly connected to the second hard disk drive read-channel gain cell.

21. The hard disk drive read-channel gain cell of claim 15, wherein the first and the second feedback loops each comprise a first and a second constant current source and a folded cascode circuit, wherein each of the first and the second constant current sources bias the folded cascode circuit.

22. The hard disk drive read-channel gain cell of claim 21, wherein each of the first and the second current mirror circuits comprise a common source circuit coupled to the second constant current source and the folded cascode circuit.

23. The hard disk drive read-channel gain cell of claim 21, wherein each of the first and the second current mirror circuits comprises cascode circuits, respectively.

24. The hard disk drive read-channel gain cell of claim 15, further comprising a second load, the second load being coupled between the differential pair.

25. The hard disk drive read-channel gain cell of claim 24, wherein the first and the second loads comprise resistive loads.

26. The hard disk drive read-channel gain cell of claim 25, wherein at least one of the first and the second loads is a MOS transistor or a combination of MOS transistors operating in a linear range.

27. The hard drive gain cell of claim 20, wherein at least one of the first and the second loads comprises a differential load.

28. The hard disk drive read-channel gain cell of claim 15, wherein the constant current source comprises a first and a second constant current source, wherein the first constant current source is coupled to the first current mirror circuit and the second constant current source is coupled to the second current mirror circuit.

29. The hard disk drive read-channel gain cell of claim 28, wherein the load comprises a differential resistive load interconnected at a common node, the common node being coupled to the common-mode feedback circuit.

30. The hard drive gain cell of claim 28, wherein the first and the second current mirror circuits each comprise a third constant current source coupled to a voltage supply.

31. The hard drive gain cell of claim 28, wherein the constant current source comprises a first and a second constant current source, wherein the first constant current source is coupled in parallel to the first current mirror circuit and the second constant current source is coupled in parallel to the second current mirror circuit.

32. The hard disk drive read-channel gain cell of claim 31, wherein the first and the second current mirror are coupled to ground by a first and a second resistor, respectively.

33. The hard disk drive read-channel gain cell of claim 32 further comprising a first and a second output, the first output coupling the second output through a differential resistor and being coupled to ground by the first and the second resistors, respectively.

34. The hard disk drive read-channel gain cell of claim 33 wherein the common-mode feedback circuit is coupled to a common node that interconnects the differential resistor.

35. A hard disk drive read-channel gain cell, comprising:
a pair of output terminals;
a first and a second current feedback loop;
   wherein the first and the second feedback loops each comprise a first and a second constant current source and a folded cascode circuit, and wherein each of the first and the second constant current sources bias the folded cascode circuit;
a differential pair comprising a first source follower circuit and a second source follower circuit, the first source follower circuit being coupled to the first current feedback loop and the second source follower circuit being coupled to the second current feedback loop;
a first current mirror circuit coupled to the first source follower circuit;
   the first current mirror circuit comprising a cascode circuit coupled to one of the output terminals;
a second current mirror coupled to the second source follower circuit;
   the second current mirror circuit comprising a cascode circuit coupled to one of the output terminals;
a differential load coupled between the first and the second current mirror circuits;
a common-mode feedback circuit coupled to the load; and
a third constant current source coupled to the first and the second current mirror circuits and to the common-mode feedback circuit, the third constant current source being configured to sink mirrored currents that flow through the first and the second current mirror circuits when controlled by the common-mode feedback circuit.

* * * * *

UNITED STATES PATENT AND TRADEMARK OFFICE
CERTIFICATE OF CORRECTION

PATENT NO. : 6,580,326 B2
DATED : June 17, 2003
INVENTOR(S) : Elmar Bach et al.

It is certified that error appears in the above-identified patent and that said Letters Patent is hereby corrected as shown below:

<u>Column 10,</u>
Line 7, before "biasing current" insert -- a --.

Signed and Sealed this

Eighteenth Day of May, 2004

JON W. DUDAS
*Acting Director of the United States Patent and Trademark Office*